(12) United States Patent
Bai et al.

(10) Patent No.: US 10,886,142 B2
(45) Date of Patent: Jan. 5, 2021

(54) ANNEALING METHOD, PROCESS CHAMBER AND ANNEALING APPARATUS

(71) Applicant: BEIJING NAURA MICROELECTRONICS EQUIPMENT CO., LTD., Beijing (CN)

(72) Inventors: Zhimin Bai, Beijing (CN); Qiang Li, Beijing (CN); Bin Deng, Beijing (CN); Yuchun Deng, Beijing (CN); Hougong Wang, Beijing (CN); Peijun Ding, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/400,659

(22) Filed: May 1, 2019

(65) Prior Publication Data
US 2019/0259628 A1    Aug. 22, 2019

Related U.S. Application Data

(63) Continuation of application No. PCT/CN2017/088423, filed on Jun. 15, 2017.

(30) Foreign Application Priority Data

Nov. 21, 2016 (CN) .......................... 2016 1 1045887

(51) Int. Cl.
*H01L 21/00* (2006.01)
*H01L 21/324* (2006.01)
(Continued)

(52) U.S. Cl.
CPC ............ *H01L 21/324* (2013.01); *H01L 21/20* (2013.01); *H01L 21/477* (2013.01);
(Continued)

(58) Field of Classification Search
CPC ..... H01L 21/324; H01L 21/20; H01L 21/477; H01L 21/67098; H01L 21/67103;
(Continued)

(56) References Cited

U.S. PATENT DOCUMENTS 4,951,601 A  *  8/1990  Maydan ............ H01L 21/67167
                                                                        118/715
6,803,297 B2   10/2004  Jennings et al.
(Continued)

FOREIGN PATENT DOCUMENTS

CN          1835649 A       9/2006
CN        101256957 A       9/2008
(Continued)

OTHER PUBLICATIONS

The World Intellectual Property Organization (WIPO) International Search Report for PCT/CN2017/088423 dated Sep. 4, 2017, 5 Pages.

*Primary Examiner* — Richard A Booth
(74) *Attorney, Agent, or Firm* — Anova Law Group, PLLC

(57) ABSTRACT

A method includes maintaining a pressure in the process chamber at a threshold before and after a wafer is transferred into the process chamber and during the annealing process of the wafer. Not only the temperature fluctuation caused by the turbulent flow of the gas during the annealing process of the wafer can be avoided, but also the time for the temperature in the chamber to recover and stabilize can be shortened, thereby improving the equipment productivity.

19 Claims, 3 Drawing Sheets

(51) Int. Cl.
*H01L 21/67* (2006.01)
*H01L 21/477* (2006.01)
*H01L 21/20* (2006.01)

(52) U.S. Cl.
CPC .... *H01L 21/6719* (2013.01); *H01L 21/67098* (2013.01); *H01L 21/67103* (2013.01); *H01L 21/67115* (2013.01); *H01L 21/67167* (2013.01); *H01L 21/67248* (2013.01)

(58) Field of Classification Search
CPC ......... H01L 21/67115; H01L 21/67167; H01L 21/6719; H01L 21/67248
See application file for complete search history.

(56) References Cited

U.S. PATENT DOCUMENTS

| | | | |
|---|---|---|---|
| 9,064,960 B2 * | 6/2015 | Lam | H01L 21/02529 |
| 2003/0186554 A1 * | 10/2003 | Tam | H01L 21/67115 |
| | | | 438/716 |
| 2006/0207120 A1 | 9/2006 | Komatsu | |
| 2008/0200038 A1 | 8/2008 | Ikeuchi et al. | |
| 2015/0030771 A1 | 1/2015 | Gelatos et al. | |

FOREIGN PATENT DOCUMENTS

| | | |
|---|---|---|
| CN | 103715067 A | 4/2014 |
| CN | 105378907 A | 3/2016 |
| TW | I403208 B | 7/2013 |
| TW | I423332 B | 1/2014 |
| TW | 201504466 A | 2/2015 |

\* cited by examiner

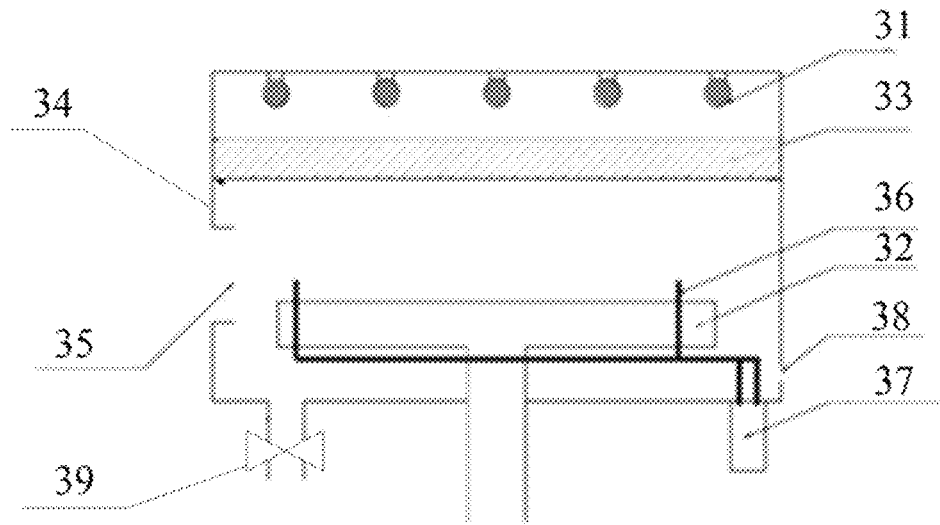

FIG. 1

```
┌─────────────────────────────────────────┐
│ Introduce a first gas into the process  │
│ chamber before the wafer is transferred │──── S21
│ into the process chamber, and maintain  │
│ the pressure of the process chamber at  │
│ a preset threshold                      │
└─────────────────────────────────────────┘
                    │
                    ▼
┌─────────────────────────────────────────┐
│ Introduce a second gas into the process │
│ chamber after the wafer is transferred  │
│ into the process chamber and during the │──── S22
│ annealing process of the wafer, and     │
│ maintain the pressure in the process    │
│ chamber at the preset threshold         │
└─────────────────────────────────────────┘
                    │
                    ▼
┌─────────────────────────────────────────┐
│ Vacuum the process chamber after the    │
│ annealing process is performed on a     │──── S23
│ preset number of wafers                 │
└─────────────────────────────────────────┘
```

ANNEALING METHOD, PROCESS CHAMBER AND ANNEALING APPARATUS

CROSS-REFERENCE TO RELATED APPLICATION

This application is a continuation application of International Application No. PCT/CN2017/088423, filed on Jun. 15, 2017, which claims priority to Chinese Patent Application No. 201611045887.1, filed on Nov. 21, 2016. The above enumerated patent applications are incorporated herein by reference.

TECHNICAL FIELD

The present disclosure relates to the field of semiconductor device manufacturing technology, and in particular, to an annealing method, a process chamber, and an annealing apparatus.

BACKGROUND

With the rapid development of the integrated circuit market, the demand for chip capacity expansion has brought new market opportunities to equipment manufacturers, and on the other hand, has placed higher demands on equipment manufacturers' existing and forward-looking technical capabilities. Equipment capacity refers to the number of good products produced by the apparatus per unit working hour, and is an important technical parameter reflecting the processing capacity of the apparatus.

SUMMARY

The disclosure provides an annealing method, and the method includes the following.

A pressure in the process chamber is maintained at a preset threshold before and after the wafer is transferred into the process chamber and during the annealing process of the wafer.

In some embodiments, before the wafer is transferred into the process chamber, the first gas is introduced into the process chamber, and the pressure of the process chamber is maintained at a preset threshold; and after the wafer is transferred into the process chamber, and during the annealing process of the wafer, a second gas is introduced into the process chamber, and the pressure in the process chamber is maintained at the preset threshold.

In some embodiments, the pressure in the process chamber is maintained at the preset threshold by controlling an exhaust flow rate of the process chamber.

In some embodiments, the method further includes vacuuming the process chamber after annealing a predetermined number of wafers.

In some embodiments, the predetermined number is 25 to 50.

In some embodiments, the first gas is $N_2$ and the second gas is a mixed gas of $N_2$ and $H_2$.

In some embodiments, a flow rate of the first gas is 100 to 500 sccm, a flow rate of $N_2$ in the second gas is 1000 sccm, and a flow rate of $H_2$ in the second gas is 300 sccm.

In some embodiments, the preset threshold is between 1 Torr to 10 Torr.

In some embodiments, the preset threshold is 2 Torr.

As another technical solution, the present disclosure also provides a process chamber, which includes a pressure control unit, which is configured to maintain a pressure in the process chamber at a preset threshold before and after a wafer is transferred into the process chamber and during an annealing process of the wafer.

In some embodiments, the gas pressure control unit includes an intake structure disposed at a top of the process chamber and configured to deliver gas into the process chamber; an exhaust structure disposed at a bottom of the process chamber and configured to exhaust gas in the process chamber; and a controller, configured to control the intake structure to introduce a first gas into the process chamber before the wafer is transferred into the process chamber, and simultaneously control the exhaust structure to maintain the pressure in the process chamber at the preset threshold; and control the intake structure to introduce a second gas into the process chamber after the wafer is transferred into the process chamber and during an annealing process of the wafer, and simultaneously control the exhaust structure to maintain the pressure in the process chamber at the preset threshold.

In some embodiments, the exhaust structure is configured with a valve configured to regulate gas flow; and the controller controls a flow rate of the process chamber by adjusting an opening degree of the valve to maintain the pressure in the process chamber at the preset threshold.

In some embodiments, the process chamber further includes a pressure sensing device, and the pressure sensing device is configured to detect pressure in the process chamber and transmit a detected value to the controller; and the controller is configured to adjust the opening degree of the valve according to the detected value and the threshold.

In some embodiments, the process chamber further includes a chamber body, at least two process sub-chambers are disposed on the chamber body, and the at least two process sub-chambers remain in communication.

In some embodiments, the at least two process sub-chambers include a first process sub-chamber and a second process sub-chamber, the first process sub-chamber and the second process sub-chamber are same in structure, arranged side by side in the horizontal direction, and connected by providing a connection sub-chamber therebetween.

In some embodiments, the intake structure includes a first intake structure and a second intake structure, and the first intake structure and the second intake structure are separately disposed at a top of the first process sub-chamber and a top of the second process sub-chamber for respectively delivering gas into the first process sub-chamber and the second process sub-chamber.

The exhaust structure includes a first exhaust structure and a second exhaust structure, and the first exhaust structure and the second exhaust structure are respectively disposed at a bottom of the first process sub-chamber and a bottom of the second process sub-chamber for respectively discharging the gas from the first process sub-chamber and the second process sub-chamber.

The controller is configured to simultaneously control the first intake structure and the second intake structure respectively to introduce the first gas into the first process sub-chamber and the second process sub-chamber before the first wafer and the second wafer are transferred into the first process sub-chamber and the second process sub-chamber respectively; simultaneously control the first intake structure and the second intake structure to respectively introduce the first gas into the first process sub-chamber and the second process sub-chamber; simultaneously control the first exhaust structure and the second exhaust structure to respectively discharge gas from the first process sub-chamber and the second process sub-chamber; and after the first wafer and the second wafer are respectively transferred into the first process sub-chamber and the second process sub-chamber and during the annealing process for the first wafer and the second wafer, simultaneously control the first intake structure and the second intake structure to respectively introduce the second gas into the first process sub-chamber and the second process sub-chamber, and simultaneously control the first exhaust structure and the second exhaust structure to respectively exhaust gas from the first process sub-chamber and the second process sub-chamber, to maintain the pressure in the first process sub-chamber and the second process sub-chamber at the preset threshold.

In some embodiments, the exhaust structure is configured with a valve for regulating gas flow; the controller controls an exhaust flow rate of the process chamber by controlling an opening degree of the valve, to maintain the pressure in the process chamber at the preset threshold.

The exhaust structure further includes an exhaust manifold, the first exhaust structure and the second exhaust structure are both connected to the exhaust manifold, and the valve is disposed on the exhaust manifold for adjusting the gas flow rate of the exhaust manifold to simultaneously adjust the gas flow rates of the first exhaust structure and the second exhaust structure.

As another technical solution, the present disclosure also provides an annealing apparatus including the above-described process chamber provided by the present disclosure.

In some embodiments, a transfer platform is further included, and the process chamber is connected to the transfer platform.

In some embodiments, the transfer platform is quadrilateral, there are three process chambers, and the three process chambers are respectively located on three sides of the transfer platform.

In some embodiments, the transfer platform is configured with a vacuum transfer robot, the annealing apparatus further includes a loading chamber, the loading chamber is located at a side of the transfer platform that is not connected to the process chamber; and the vacuum transfer robot is configured to transfer the wafers from the loading chamber into the first process sub-chamber or the second process sub-chamber of the process chamber, respectively.

The disclosure can achieve the following beneficial effects.

The present disclosure provides an annealing method for maintaining the pressure of the process chamber at the preset threshold, before and after the wafer is transferred into the process chamber and during the annealing process of the wafer, that is, the pressure is always constant in the chamber, which not only avoids the temperature fluctuation caused by the turbulent flow of the gas during the annealing process of the wafer, but also shortens the time for the temperature of the chamber to restore stability, thereby increasing the equipment capacity.

The process chamber provided by the disclosure can maintain the pressure of the process chamber at a preset threshold by using the gas pressure control unit before and after the wafer is transferred into the process chamber and during the annealing process of the wafer. The temperature fluctuation caused by the turbulent flow of the gas during the annealing process of the wafer by the heating unit can be avoided, and the time for the temperature of the chamber to restore stability can be shortened, thereby increasing the equipment capacity.

The annealing apparatus provided by the embodiment of the present disclosure utilizes the above-mentioned process chamber provided by the embodiment of the present disclosure, which can avoid the temperature fluctuation caused by the turbulent flow of gas during the annealing process of the wafer by the heating unit, and shorten the time for the temperature in the chamber to restore stability, thereby increasing equipment capacity.

DESCRIPTION OF THE DRAWINGS

FIG. 1 is a schematic structural view of a process chamber;

FIG. 2 is a schematic flow chart of an annealing process according to some embodiments of the present disclosure;

Figure 3A:
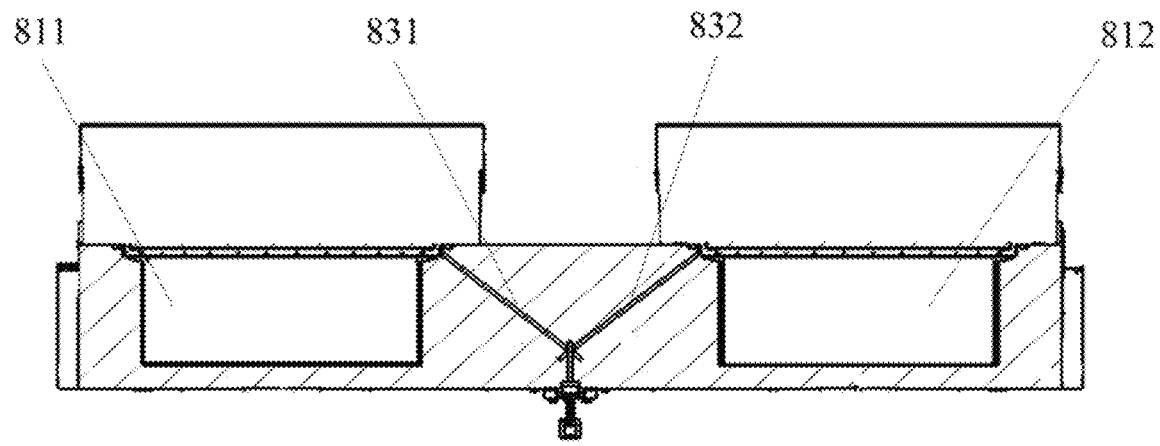
FIG. 3a is a schematic diagram of an intake structure of a process chamber according to some embodiments of the present disclosure.

Descriptions of reference numerals are as follows: 1—transfer platform, 2—vacuum transfer robot, 4—loading chamber, 5—equipment front-end module, 6—atmospheric transfer robot, 7—wafer loading box, 8—process chamber, 31—bulb, 32—heater, 33—quartz cover, 34—cavity, 35—entrance, 36—wafer tip finger, 37—gas cylinder, 38—gas inlet, 39—angle valve, 81—chamber body, 83—valve, 811—first process sub-chamber, 812—second process sub-chamber, 813—connection sub-chamber, 821—first exhaust structure, 822—second exhaust structure, 823—exhaust manifold, 831—first intake structure, and 832—second intake structure.

DETAILED DESCRIPTION

The technical solutions in the present disclosure are clearly and completely described in the following with reference to the accompanying drawing. Certainly, embodiments described are merely a part not all of the embodiments of the present disclosure. All other embodiments obtained by a person of ordinary skill in the art based on the embodiments of the present disclosure without creative efforts are within the scope of the present disclosure.

FIG. 1 is a schematic view showing the structure of a conventional process chamber. As shown in FIG. 1, the process chamber includes two heating units, a bulb 31 and a heater 32, and is therefore referred to as a dual-mode heating mode process chamber. The bulb 31 can increase a temperature rising rate of the chamber and maintain temperature uniformity. The process chamber 3 also includes a quartz cover 33 and a cavity 34 that are sealed by a seal ring (not shown) to form a vacuum environment within the cavity 34. An entrance 35 for transferring the wafer is also disposed on the cavity 34, and a wafer tip finger 36 is also disposed in the cavity 34 and connected to the cylinder 37. Driven by the gas cylinder 37, the wafer tip finger 36 can be coupled to the robot to transfer the wafer to the heater 32. In the process of performing the annealing process, first, the wafer is transferred to the heater 32 in the cavity 34. Then, an annealing process is performed, and in this process, the process gas is introduced into the cavity 34 through the gas inlet 38, and then the angle valve 39 of the vent is closed to maintain the process pressure in the cavity 34 at 1 to 10 T, which can facilitate the heater 32 to sufficiently transfer heat to the wafer.

However, the process gas is introduced after the wafer enters the cavity 34, and the temperature of the process gas is low, resulting causing temperature fluctuation generated inside the cavity 34, thereby affecting the annealing of the wafer. Moreover, after the process gas is introduced, the temperature in the cavity 34 can be gradually stabilized only after the pressure in the cavity 34 is stabilized, and the temperature fluctuation time is relatively long. As such not only the equipment capacity can be affected, but also for a short-time annealing process, the temperature fluctuation in the cavity 34 cannot satisfy the process requirement.

For the above-mentioned deficiencies in the existing technologies, the disclosure provides an annealing method, a process chamber and an annealing apparatus to solve the problem of the large temperature fluctuation in the process chamber and low equipment capacity.

Embodiments of the present disclosure provide an annealing method for maintaining a pressure of a process chamber at a preset threshold, before and after a wafer is transferred into a process chamber and during an annealing process of the wafer, that is, the pressure is always constant in a chamber, which not only avoids the temperature fluctuation caused by the turbulent flow of the gas during the annealing process of the wafer, but also shortens the time for the temperature of the chamber to restore stability, thereby increasing the equipment capacity.

Embodiments of the disclosure further provides an annealing method, and the annealing method is described in detail below with reference to FIG. 2. As shown in FIG. 2, the method includes the following steps.

S21, before the wafer is transferred into the process chamber, the first gas is introduced into the process chamber, and the pressure of the process chamber is maintained at a preset threshold.

In some embodiments, the first gas is $N_2$. The flow rate of the first gas is 100 to 500 sccm. The above preset threshold may be 1 Torr-10 Torr. In some embodiments, the preset threshold is 2 Torr.

S22, after the wafer is transferred into the process chamber, and during the annealing process of the wafer, a second gas is introduced into the process chamber, and the pressure in the process chamber is maintained at the preset threshold.

In some embodiments, the second gas is a mixed gas of $N_2$ and $H_2$, where a flow rate of $N_2$ is 1000 sccm, and a flow rate of $H_2$ is 300 sccm.

During the annealing process, the gas in the chamber is exhausted while the gas is introduced into the process chamber, to make the gas in the chamber in a flowing state, so that contaminants generated at a high temperature on the surface of the wafer can be carried out from the process chamber, thereby improving the efficiency of contamination treatment. In some embodiments, the pressure in the process chamber can be maintained at the preset threshold by controlling the exhaust flow rate of the process chamber.

It should be noted that before and after the annealing process, the pressure is controlled to be stable, so that when the wafer is transferred by using a vacuum transfer robot to a process chamber, it is necessary to consider the pressure difference between the two sides of the slit valve of the process chamber and the position of the wafer. For this reason, by installing a pressure gauge and a needle valve in the transfer chamber of the transfer platform, the pressure in the transfer chamber can be adjusted to be equal to the pressure in the process chamber, thereby ensuring the pressure in the process chamber remaining the same when the slit valve is open for pick-up of the wafer.

It can be seen through the above steps S21-S22 that the first gas is introduced into the process chamber before the wafer is transferred into the process chamber, so that the pressure of the process chamber is maintained at the preset threshold. After the wafer is transferred into the process chamber and during the annealing process of the wafer, a second gas is introduced into the process chamber to maintain the pressure in the process chamber at the preset threshold, that is, the pressure in the chamber is constant, which not only avoids the temperature fluctuation caused by the turbulent flow of the gas during the annealing process of the wafer, but also shortens the time for the temperature of the chamber to restore stability, thereby increasing the equipment capacity.

In practical applications, although the gas in the process chamber is always flowing during the annealing process, some of the contaminants can be taken away, but inevitably there are little contaminants remaining in the cavity. Therefore, when the process chamber is continuously operated for a period of time, the contaminations generated during the annealing process are accumulated to a certain extent, and maintenance is required to be performed on the process chamber. To this reason, the annealing method provided by the embodiment of the disclosure further includes the following steps:

S23, after the annealing process is performed on a preset number of wafers, the process chamber is vacuumed.

In some embodiments, the vacuuming may be performed by using a base vacuuming method, that is, in the case where no wafer is placed in the process chamber, the process chamber is vacuumed until the gas in the process chamber is completely extracted to obtain a higher degree of vacuum.

In some embodiments, the preset number is 25-50 pieces, that is, after continuously annealing 25 to 50 pieces of wafers, the contamination residual in the process chamber can be further removed by vacuuming the process chamber.

In some embodiments, the number of transferred wafers may be counted by a controller for controlling the vacuum transfer robot, and if the number of wafers transferred to each process chamber is greater than or equal to a preset number, the process chamber is vacuumed. If the number of wafers transferred to each process chamber is less than the preset number, the wafer is continuously transferred into the process chamber and the annealing process continues.

As another technical solution, the present disclosure also provides a process chamber including a gas pressure control unit for maintaining the pressure in process chamber at the preset threshold before and after transferring the wafer into a process chamber and during an annealing process on the wafer.

The process chamber provided by the embodiment of the disclosure can maintain the pressure of the process chamber at a preset threshold by using the gas pressure control unit both before and after the wafer is transferred into the process chamber and during the annealing process of the wafer. The temperature fluctuation caused by the turbulent flow of the gas during the annealing process of the wafer by the heating unit can be avoided, and the time for the temperature of the chamber to restore stability can be shortened, thereby increasing the equipment capacity.

In some embodiments, the gas pressure control unit discharges the gas in the chamber while introducing gas into the process chamber to maintain the pressure in the process chamber at the preset threshold. In this way, the gas in the chamber can be in a flowing state, so that the contaminations generated at a high temperature on the surface of the wafer can be taken out from the process chamber, thereby improving the efficiency of the treatment of the contaminations. In some embodiments, the pressure in the process chamber can be maintained at the preset threshold by controlling the exhaust flow rate of the process chamber.

In some embodiments, the pressure control unit includes an intake structure, an exhaust structure, and a controller, where the intake structure is disposed at a top of the process chamber and configured to deliver gas into the process chamber; and the exhaust structure is disposed at a bottom of the process chamber and configured to exhaust gas in the process chamber; a controller is configured to control the intake structure to introduce a first gas into the process chamber before the wafer is transferred into the process chamber, and simultaneously control the exhaust structure to maintain the pressure in the process chamber at the preset threshold; and control the intake structure to introduce a second gas into the process chamber after the wafer is transferred into the process chamber and during an annealing process of the wafer, and simultaneously control the exhaust structure to maintain the pressure in the process chamber at the preset threshold.

Figure 3B:
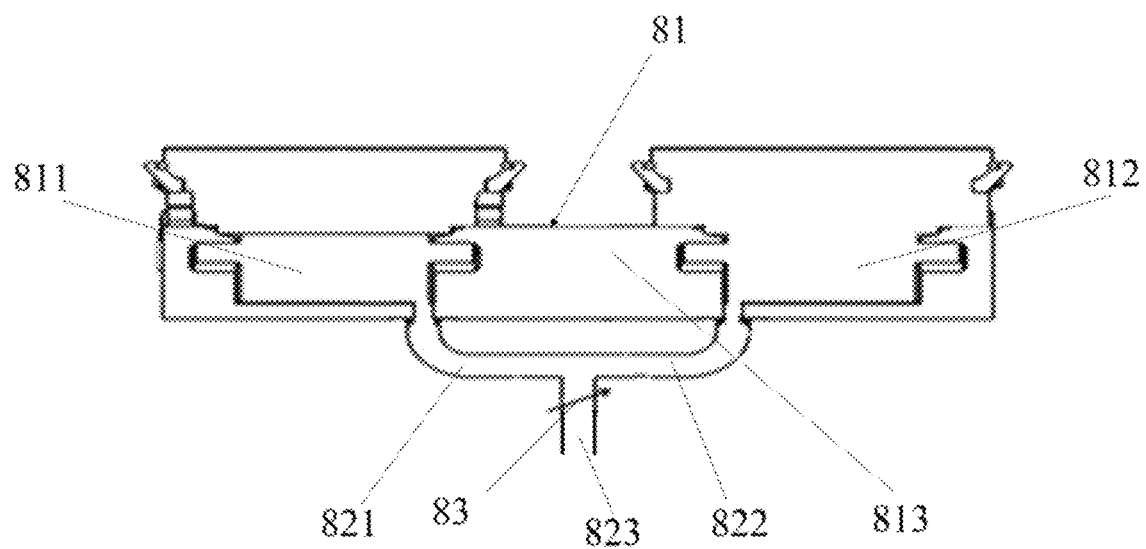
FIG. 3b is a schematic diagram of an overall structure of a process chamber according to some embodiments of the present disclosure.

In the present embodiment, as shown in FIGS. 3a and 3b, the process chamber 8 includes a chamber body 81. Two process sub-chambers are disposed on the chamber body 81 and the two process sub-chambers remain in communication. In some embodiments, the two process sub-chambers are a first process sub-chamber 811 and a second process sub-chamber 812, respectively, and the first process sub-chamber 811 and the second process sub-chamber 812 are same in structure and arranged side by side in the horizontal direction and connected by a connection sub-chamber 813 provided therebetween.

By arranging two process sub-chambers of the same structure and symmetrically disposed on the chamber body and setting the connection chamber to connect the two process sub-chambers, the two wafers in the two process sub-chambers can be simultaneously annealed, thereby reducing the process time by half, increasing process efficiency and equipment capacity.

Further, the intake structure includes a first intake structure 831 and a second intake structure 832, which are respectively disposed at the top of the first process sub-chamber 811 and the second process sub-chamber 812 for respectively for respectively delivering gas into the first process sub-chamber 811 and the second process sub-chamber 812. The exhaust structure includes a first exhaust structure 821 and a second exhaust structure 822, the first exhaust structure 821 and the second exhaust structure 822 are respectively disposed at a bottom of the first process sub-chamber 811 and a bottom of the second process sub-chamber 812 for respectively discharging the gas from the first process sub-chamber 811 and the second process sub-chamber 812.

The controller is configured to simultaneously control the first intake structure 831 and the second intake structure 832 respectively to introduce the first gas into the first process sub-chamber 811 and the second process sub-chamber 812 before the first wafer and the second wafer are transferred into the first process sub-chamber 811 and the second process sub-chamber 812 respectively; simultaneously control the first intake structure 831 and the second intake structure 832 to respectively introduce the first gas into the first process sub-chamber 811 and the second process sub-chamber 812; simultaneously control the first exhaust structure 821 and the second exhaust structure 822 to respectively discharge gas from the first process sub-chamber 811 and the second process sub-chamber 812; and after the first wafer and the second wafer are respectively transferred into the first process sub-chamber 811 and the second process sub-chamber 812 and during the annealing process for the first wafer and the second wafer, simultaneously control the first intake structure 831 and the second intake structure 832 to respectively introduce the second gas into the first process sub-chamber 811 and the second process sub-chamber 812, and simultaneously control the first exhaust structure 821 and the second exhaust structure 822 to respectively exhaust gas from the first process sub-chamber 811 and the second process sub-chamber 812, to maintain the pressure in the first process sub-chamber 811 and the second process sub-chamber 812 at the preset threshold.

Both of the first intake structure 831 and the second intake structure 832 described above may be intake pipes. Both of the above first exhaust structure 821 and the second exhaust structure 822 described above may be exhaust pipes.

In some embodiments, a valve 83 for regulating the flow of the gas is disposed on the exhaust structure. Moreover, the controller can control the exhaust flow rate of the process chamber by adjusting an opening degree of the valve to maintain the pressure in the process chamber at the preset threshold. It is easy to understand that the larger the opening degree of the valve, the larger the exhaust flow rate of the process chamber; conversely, the smaller the opening degree of the valve, the smaller the exhaust flow rate of the process chamber. In some embodiments, the valve 83 can be a pressure butterfly valve.

In some embodiments, the exhaust structure further includes an exhaust manifold. The first exhaust structure 821 and the second exhaust structure 822 are both connected to the exhaust manifold, and the valve 83 is disposed on the exhaust manifold for adjusting the gas flow rate of the exhaust manifold, so as to simultaneously adjust the gas flow rates of the first exhaust structure 821 and the second exhaust structure 822.

Further, as shown in FIG. 3b, the exhaust structure further includes an exhaust manifold 823, the first exhaust structure 821 and the second exhaust structure 822 are both connected to the exhaust manifold 823, and the valve 83 is disposed at the exhaust manifold 823 for adjusting the gas flow rate of the exhaust manifold, so as to simultaneously adjust the gas flow rates of the first exhaust structure 821 and the second exhaust structure 822, thereby realizing simultaneously controlling the exhaust flow rates of the first process sub-chamber 811 and the second process sub-chamber 812.

The first process sub-chamber 811, and the second process sub-chamber 812 and the connection chamber 813 are in communication with each other, and the pressures in the three chambers are hence the same. Therefore, in order to detect the pressure in the process chamber, the pressure detecting device can be disposed in any one of the above three chambers. In some embodiments, a pressure detecting device (not shown) is disposed in the first process sub-chamber 811, and the second process sub-chamber 812 or the connecting chamber 813. The pressure detecting device is configured to detect the pressure in the process chamber and send the detected value to the controller. The controller is configured to control the opening degree of the valve 83 according to the detected value and the preset threshold, thereby implementing a closed-loop control and more accurately controlling the pressure in the process chamber.

In some embodiments, the preset threshold may be set in the controller in advance. Generally, the preset threshold may be set as 1 Torr to 10 Torr. In some embodiments, the preset threshold may be 2 Torr.

When determining that the detected value is greater than the preset threshold, the controller controls to increase the opening degree of the control valve 83 to increase the exhaust flow rate of the first process sub-chamber 811 and the second process sub-chamber 812, thereby reducing the pressure in the first process sub-chamber 811 and the second process sub-chamber 812. When determining that the detected value is less than the threshold, the controller controls to decrease the opening degree of the control valve 83 to reduce the exhaust flow rate of the first process sub-chamber 811 and the second process sub-chamber 812, thereby increasing the pressure in the first process sub-chamber 811 and the second process sub-chamber 812. When determining that the detected value is equal to the preset threshold, the controller controls to maintain the current opening degree of the valve 83 unchanged to maintain the exhaust flow rate of the first process sub-chamber 811 and the second process sub-chamber 812, thereby maintaining the pressure in the first process sub-chamber 811 and the second process sub-chamber 812 at the current value.

It should be noted that, in this embodiment, there are two process sub-chambers, but the present disclosure is not limited thereto. In practical applications, there may be three, four, or more process sub-chambers. Three or more process sub-chambers remain connected. In addition, the number of connection chambers, intake structures, and exhaust structures should correspond to the number of process sub-chambers.

In summary, the process chamber provided by the embodiment of the present disclosure maintains the pressure of the process chamber by using the gas pressure control unit before and after the wafer is transferred into the process chamber and during the annealing process of the wafer. Not only the temperature fluctuation caused by the turbulent flow of the gas during the annealing process of the wafer by the heating unit can be avoided, but also the time for the temperature of the chamber to restore stability can be shortened, thereby increasing the equipment capacity.

Figure 4:
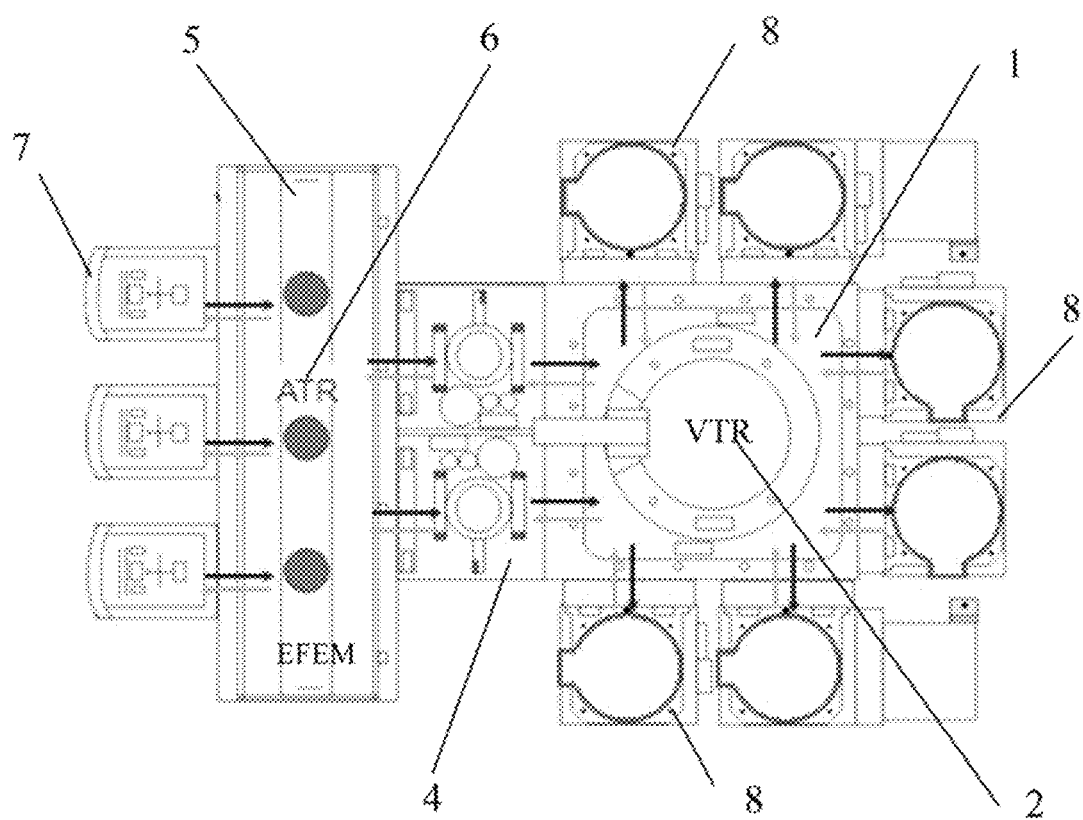
FIG. 4 is a schematic structural diagram of an annealing apparatus according to some embodiments of the present disclosure.

As another technical solution, as shown in FIG. 4, some embodiments of the present disclosure further provide an annealing apparatus including a process chamber 8. The process chamber 8 adopts the above-described process chamber provided by the embodiments of the present disclosure.

Further, the annealing apparatus further includes a transfer platform 1, where the processing chamber 8 is connected to the transfer platform 1.

In the embodiment of the present disclosure, as shown in FIG. 4, the transfer platform 1 has a quadrangular shape. To further increase the equipment capacity, In some embodiments, there are three the process chambers 8, and the three process chambers 8 are respectively located at three sides of the transfer platforms 1.

Each process chamber 8 includes two process sub-chambers (i.e., the first process sub-chamber 811 and the second process sub-chamber 812), each process chamber 8 can simultaneously performing annealing process for two wafers. That is, the annealing apparatus can simultaneously perform annealing process for six wafers, thereby greatly increasing the equipment capacity. Of course, in practical applications, more process sub-chambers may be set according to specific needs, or the transfer platform 1 may be set as a pentagon or other polygons to further increase the number of process chambers 8, thereby increasing equipment capacity.

In the present embodiment, the transfer platform 1 is provided with a vacuum transfer robot (VTR) 2, and the annealing apparatus further includes a loading chamber 4. The loading chamber 4 is located on a side of the transfer platform 1 that is not connected to the processing chamber 8. That is, the loading chamber 4 and the processing chamber 8 are disposed at four sides of the transfer platform 1 and are connected to the transfer platform 1.

The vacuum manipulator 2 is configured to transfer the wafer from the loading chamber 4 into the first process sub-chamber 811 and the second process sub-chamber 812 of the process chamber 8 for the annealing process.

After annealed, the wafer is picked up from the process chamber 8 by the vacuum transfer robot 2 and then transferred to the loading chamber 4. Cold water passes through the loading chamber 4 to cool the wafer after the high temperature process.

In this embodiment, as shown in FIG. 4, the annealing apparatus further includes an equipment front-end module (EFEM) 5, and the front-end module 5 has an atmospheric environment. An atmospheric transfer robot (ATR) 6 is disposed therein, which can transfer the wafer from the wafer loading box 7 to the loading chamber. The atmospheric transfer robot 6 is provided with a clamping mechanism for correcting the position of the wafer on the hand.

It should be noted that each process chamber 8 of the annealing apparatus provided by the embodiment of the present disclosure is independent from each other, and the three process chambers 8 can simultaneously perform an annealing process, or may be at least one of the three process chambers 8 can be selected for production according to actual production needs, making the annealing apparatus more flexible and adaptable.

In summary, the annealing apparatus provided by the embodiment of the present disclosure utilizes the above-mentioned process chamber provided by the embodiment of the present disclosure, which can avoid the temperature fluctuation caused by the turbulent flow of gas during the annealing process of the heating unit, and shorten the time for the temperature in the chamber to restore stability, thereby increasing equipment capacity.

It is to be understood that the above embodiments are merely exemplary embodiments employed to explain the principles of the disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A process chamber, comprising:
A chamber body including at least two process sub-chambers and a connection sub-chamber, the at least two process sub-chambers including a first process sub-chamber and a second process sub-chamber, wherein:
The connection sub-chamber is configured to enable a constant communication between the first process sub-chamber and the second process sub-chamber, and a first pressure in the first process sub-chamber, a second pressure in the second process sub-chamber, and a third pressure in the connection sub-chamber are identical, and
The first process sub-chamber and the second process sub-chamber are same in structure, and the first process sub-chamber, the connection sub-chamber, and the second process sub-chamber are arranged horizontally along a straight line; and A pressure control unit including an intake structure, an exhaust structure, and a controller, wherein:

Before a wafer is transferred to each of the first process sub-chamber and the second process sub-chamber and in response to the controller controlling an intake structure to introduce a first gas into the process chamber, the controller is configured to control the exhaust structure to exhaust gas from the first process sub-chamber and the second process sub-chamber simultaneously to maintain a pressure in the process chamber at a threshold, After the wafers are transferred into the process chamber and during an annealing process of the wafers and in response to the controller controlling the intake structure to introduce a second gas into the process chamber, the controller is configured to control the exhaust structure to exhaust the gas from the first process sub-chamber and the second process sub-chamber simultaneously to maintain the pressure in the process chamber at the threshold, the second gas being different from the first gas, and The connection sub-chamber is configured to enable the first process sub-chamber and the second process sub-chamber to have a same pressure at the threshold, thereby making the gas in the process chamber in a flowing state to improve an efficiency of a contamination treatment.

2. The process chamber of claim 1, wherein:
the intake structure is disposed at a top of the process chamber; and
the exhaust structure is disposed at a bottom of the process chamber.

3. The process chamber of claim 2, wherein:
the exhaust structure is configured with a valve configured to regulate gas flow; and
the controller controls an exhaust flow rate of the process chamber by adjusting an opening degree of the valve to maintain the pressure in the process chamber at the threshold.

4. The process chamber of claim 3, wherein:
the process chamber further comprises a pressure sensing device configured to detect pressure in the process chamber and transmit a detected value to the controller; and
the controller is configured to adjust an opening degree of the valve according to the detected value and the threshold.

5. The process chamber of claim 1, wherein the first process sub-chamber and the second process sub-chamber are same in structure and arranged side by side in a horizontal direction.

6. The process chamber of claim 5, wherein:
the intake structure comprises a first intake structure and a second intake structure, the first intake structure and the second intake structure being separately disposed at a top of the first process sub-chamber and a top of the second process sub-chamber for respectively delivering gas into the first process sub-chamber and the second process sub-chamber;
the exhaust structure includes a first exhaust structure and a second exhaust structure, the first exhaust structure and the second exhaust structure being respectively disposed at a bottom of the first process sub-chamber and a bottom of the second process sub-chamber for respectively discharging the gas from the first process sub-chamber and the second process sub-chamber; and
the controller is configured to before the wafers are transferred into the first process sub-chamber and the second process sub-chamber respectively, simultaneously control the first intake structure and the second intake structure respectively to introduce the first gas into the first process sub-chamber and the second process sub-chamber, and simultaneously control the first exhaust structure and the second exhaust structure to respectively discharge the gas from the first process sub-chamber and the second process sub-chamber; and after the wafers are respectively transferred into the first process sub-chamber and the second process sub-chamber and during the annealing process for the wafers, simultaneously control the first intake structure and the second intake structure to respectively introduce the second gas into the first process sub-chamber and the second process sub-chamber, and simultaneously control the first exhaust structure and the second exhaust structure to respectively exhaust the gas from the first process sub-chamber and the second process sub-chamber, to maintain the pressure in the first process sub-chamber and the second process sub-chamber at the threshold.

7. The process chamber of claim 6, wherein:
the exhaust structure is configured with a valve for regulating gas flow; the controller controls an exhaust flow rate of the process chamber by controlling an opening degree of the valve, to maintain the pressure in the process chamber at the threshold; and
the exhaust structure further includes an exhaust manifold, the first exhaust structure and the second exhaust structure are both connected to the exhaust manifold, and the valve is disposed on the exhaust manifold for adjusting the gas flow rate of the exhaust manifold to simultaneously adjust the gas flow rates of the first exhaust structure and the second exhaust structure.

8. An annealing apparatus, comprising: a process chamber that includes a chamber body having at least two process sub-chambers and a connection sub-chamber, and a pressure control unit having an intake structure, an exhaust structure, and a controller, the at least two process sub-chambers including a first process sub-chamber and a second process sub-chamber, and the connection sub-chamber communicating the first process sub-chamber and the second process sub-chamber, wherein:
before a wafer is transferred to each of the first process sub-chamber and the second process sub-chamber: in response to the controller controlling the intake structure to introduce a first gas into the process chamber, the controller controls the exhaust structure to exhaust gas from the first process sub-chamber and the second process sub-chamber simultaneously to maintain a pressure in the process chamber at a threshold,
after the wafers are transferred into the process chamber and during an annealing process of the wafers: in response to the controller controlling the intake structure to introduce a second gas into the process chamber, the controller controls the exhaust structure to exhaust the gas from the first process sub-chamber and the second process sub-chamber simultaneously to maintain the pressure in the process chamber at the threshold, the second gas being different from the first gas, and
the connection sub-chamber is configured to enable the first process sub-chamber and the second process sub-chamber to have a same pressure at the threshold, thereby making the gas in the process chamber in a flowing state to improve an efficiency of a contamination treatment.

9. The annealing apparatus of claim 8, wherein:
the intake structure is disposed at a top of the process chamber; and
the exhaust structure is disposed at a bottom of the process chamber.

10. The annealing apparatus of claim 8, further comprising a transfer platform connected to the process chamber.

11. The annealing apparatus of claim 10, wherein:
the transfer platform is configured with a vacuum transfer robot, the annealing apparatus further includes a loading chamber, the loading chamber being located at a side of the transfer platform that is not connected to the process chamber; and
the vacuum transfer robot is configured to transfer the wafers from the loading chamber into the first process sub-chamber and the second process sub-chamber of the process chamber.

12. An annealing method applied in a process chamber comprising a chamber body that includes at least two process sub-chambers and a connection sub-chamber, and a pressure control unit that includes an intake structure, an exhaust structure and a controller, the at least two process sub-chambers including a first process sub-chamber and a second process sub-chamber, and the connection sub-chamber communicating the first process sub-chamber and the second process sub-chamber, wherein:
the connection sub-chamber is configured to enable a constant communication between the first process sub-chamber and the second process sub-chamber, and a first pressure in the first process sub-chamber, a second pressure in the second process sub-chamber, and a third pressure in the connection sub-chamber are identical;
the first process sub-chamber and the second process sub-chamber are same in structure, and the first process sub-chamber, the connection sub-chamber, and the second process sub-chamber are arranged horizontally along a straight line; and
the method comprises:
before a wafer is transferred to each of the first process sub-chamber and the second process sub-chamber and in response to the controller controlling the intake structure to introduce a first gas into the process chamber, configuring the controller to control the exhaust structure to exhaust gas from the first process sub-chamber and the second process sub-chamber simultaneously to maintain a pressure in the process chamber at a threshold;
after the wafers are transferred into the process chamber and during an annealing process of the wafers and in response to the controller controlling the intake structure to introduce a second gas into the process chamber, configuring the controller to control the exhaust structure to exhaust the gas from the first process sub-chamber and the second process sub-chamber simultaneously to maintain the pressure in the process chamber at the threshold, the second gas being different from the first gas; and
enabling, through the connection sub-chamber, the first process sub-chamber and the second process sub-chamber to have a same pressure at the threshold, thereby making the gas in the process chamber in a flowing state to improve an efficiency of a contamination treatment.

13. The annealing method of claim 12, further comprising:
introducing, through the intake structure disposed at a top of the process chamber, the first gas and the second gas into the process chamber; and
exhausting, through the exhaust structure disposed at a bottom of the process chamber, the gas from the process chamber.

14. The annealing method of claim 13, wherein maintaining the pressure in the process chamber at the threshold including controlling an exhaust flow rate of the process chamber to maintain the pressure in the process chamber at the threshold.

15. The annealing method of claim 12, further comprising:
vacuuming the process chamber after annealing a number of wafers.

16. The annealing method of claim 12, wherein the first gas is $N_2$ and the second gas is a mixed gas of $N_2$ and $H_2$.

17. The annealing method of claim 16, wherein a flow rate of the first gas is between about 100 and about 500 sccm, a flow rate of $N_2$ in the second gas is about 1000 sccm, and a flow rate of $H_2$ in the second gas is about 300 sccm.

18. The annealing method of claim 12, wherein the threshold is between about 1 Torr and about 10 Torr.

19. The annealing method of claim 18, wherein the threshold is about 2 Torr.

* * * * *